(12) United States Patent
Satitpunwaycha et al.

(10) Patent No.: US 7,785,172 B2
(45) Date of Patent: Aug. 31, 2010

(54) COMBINATORIAL PROCESSING INCLUDING ROTATION AND MOVEMENT WITHIN A REGION

(75) Inventors: Peter Satitpunwaycha, Sunnyvale, CA (US); Richard Endo, San Carlos, CA (US); Zachary Fresco, Santa Clara, CA (US); Nitin Kumar, Menlo Park, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 11/838,653

(22) Filed: Aug. 14, 2007

(65) Prior Publication Data
US 2009/0047881 A1 Feb. 19, 2009

(51) Int. Cl.
*B24B 49/00* (2006.01)
*B24B 1/00* (2006.01)
(52) U.S. Cl. ............... 451/8; 451/51; 451/287; 451/291
(58) Field of Classification Search .......... 451/5, 451/8–11, 41, 57, 59, 60, 285–289, 446, 451/291
See application file for complete search history.

(56) References Cited

U.S. PATENT DOCUMENTS

| | | | |
|---|---|---|---|
| 5,603,351 A | 2/1997 | Cherukuri et al. | |
| 6,040,193 A | 3/2000 | Winkler et al. | |
| 6,051,500 A | 4/2000 | Maury et al. | |
| 6,063,633 A | 5/2000 | Wilson, III | |
| 6,179,695 B1 * | 1/2001 | Takahashi et al. | 451/287 |
| 6,268,219 B1 | 7/2001 | McBride | |
| 6,270,392 B1 * | 8/2001 | Hayashi et al. | 451/5 |
| 6,306,658 B1 | 10/2001 | Turner et al. | |
| 6,329,301 B1 * | 12/2001 | Zahorik et al. | 438/745 |
| 6,368,562 B1 | 4/2002 | Yao | |
| 6,439,963 B1 * | 8/2002 | Rangarajan et al. | 451/8 |
| 6,506,099 B1 * | 1/2003 | Bartlett | 451/41 |
| 6,567,718 B1 * | 5/2003 | Campbell et al. | 700/121 |
| 6,620,027 B2 * | 9/2003 | Zutshi et al. | 451/5 |
| 6,623,333 B1 * | 9/2003 | Patel et al. | 451/9 |
| 6,751,518 B1 * | 6/2004 | Sonderman et al. | 700/121 |
| 6,756,109 B2 | 6/2004 | Warren et al. | |
| 6,794,289 B2 | 9/2004 | Hudson | |
| 6,818,110 B1 | 11/2004 | Warren et al. | |
| 6,834,990 B2 | 12/2004 | Nielsen | |
| 6,864,092 B1 | 3/2005 | Turner et al. | |
| 6,890,492 B1 | 5/2005 | Turner et al. | |
| 6,902,934 B1 | 6/2005 | Bergh et al. | |
| 6,924,149 B2 | 8/2005 | Turner et al. | |
| 6,955,987 B2 | 10/2005 | Wu | |

(Continued)

OTHER PUBLICATIONS

Erichsen, Thomas, Combinatorial Microelectrochemistry: Development and Evaluation of an Electrochemical Robotic System, Review of Scientific Instruments, 76, 062204 (2005).

(Continued)

*Primary Examiner*—Dung Van Nguyen (57) ABSTRACT

Combinatorial processing including rotation and movement within a region is described, including defining multiple regions of at least one substrate, processing the multiple regions of the at least one substrate in a combinatorial manner, rotating a head in one of the multiple regions to perform the processing, and repositioning the head relative to the one of the multiple regions while rotating the head during the processing.

13 Claims, 9 Drawing Sheets

U.S. PATENT DOCUMENTS

| | | | |
|---|---|---|---|
| 6,994,827 B2 | 2/2006 | Safir et al. | |
| 7,025,854 B2 | 4/2006 | Boyd et al. | |
| 7,045,358 B2 | 5/2006 | Chandler | |
| 7,115,234 B2 | 10/2006 | Freitag et al. | |
| 7,153,195 B2 * | 12/2006 | Lee et al. | 451/28 |
| 7,172,732 B2 | 2/2007 | Van Erden et al. | |
| 7,264,535 B2 | 9/2007 | Guthrie et al. | |
| 7,288,229 B2 | 10/2007 | Turner et al. | |
| 7,354,332 B2 | 4/2008 | Surana et al. | |
| 2002/0106813 A1 | 8/2002 | Smith et al. | |
| 2003/0032198 A1 | 2/2003 | Lugmair et al. | |
| 2003/0203709 A1 * | 10/2003 | Peng et al. | 451/57 |
| 2005/0054268 A1 | 3/2005 | Kistler et al. | |
| 2005/0064251 A1 | 3/2005 | Li et al. | |
| 2005/0232074 A1 | 10/2005 | Higashihara et al. | |
| 2005/0287573 A1 | 12/2005 | Stafslien et al. | |
| 2006/0083664 A1 | 4/2006 | Bahr | |
| 2006/0205322 A1 | 9/2006 | Kalenian et al. | |
| 2007/0029189 A1 | 2/2007 | Zach | |

OTHER PUBLICATIONS

PCT/US2008/066424 International Search Report, Sep. 23, 2008.
WO2009/023663 PCT Search Report, Apr. 9, 2009.
U.S. Appl. No. 11/763,180 Office Action, Feb. 27, 2010.

* cited by examiner

COMBINATORIAL PROCESSING INCLUDING ROTATION AND MOVEMENT WITHIN A REGION

CROSS-REFERENCE TO RELATED APPLICATIONS

This application is related to U.S. patent application Ser. No. 11/352,077 entitled "Methods for Discretized Processing and Process Sequence Integration of Regions of a Substrate" and filed Feb. 10, 2006; and is related to U.S. patent application Ser. No. 11/763,180, entitled "Combinatorial Processing Including Stirring" and filed Jun. 14, 2007, which are herein incorporated by reference.

FIELD OF THE INVENTION

The present invention relates generally to semiconductor processing. More specifically, combinatorial processing including rotation and movement within a region is described.

BACKGROUND OF THE INVENTION

Semiconductor processing includes various techniques performed on a substrate to form electronic devices such as integrated circuits. Examples of such techniques include layer deposition (e.g., using electroless or electrochemical deposition, physical vapor deposition, or chemical vapor deposition), cleaning techniques, and chemical mechanical planarization.

Chemical mechanical planarization (CMP) is a technique used to create a level (i.e., planar) surface on a substrate. CMP is typically used to remove excess metal and other unwanted materials when forming metallization on a substrate during back end of the line (BEOL) semiconductor processes. CMP is performed by dispensing a chemical slurry onto the substrate, and rotating a pad having abrasive particles over the substrate surface. The rotation polishes the surface to create a smooth, level surface.

Combinatorial processing may refer to various techniques to vary characteristics of the processes applied to multiple regions of a substrate in serial, parallel or parallel-serial fashion. Combinatorial processing may be used to test and compare multiple and various processing techniques. The processing techniques may be validated, and those techniques that are useful may be applied to, for example, different substrates or full-substrate processing.

Thus, what is needed is techniques for performing combinatorial processing to evaluate CMP and other processes using movement within a region.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, combinatorial processing including rotating heads that move (i.e., are repositioned) within a region is described. Combinatorial processing includes dividing one or more substrates into multiple regions in which various processes are performed. The multiple regions are defined by physically isolating areas of a substrate, physically dividing one or more substrates (e.g., dicing), or having no barriers between regions, for example. A rotating head or multiple heads are located within each region of the substrate, and the head(s) is repositioned within the region using various techniques. Even though the following examples each show one head, one skilled in the art could modify them to work with multiple heads. For example, the head can be repositioned linearly or epicyclically (i.e., in a planetary fashion), or the substrate is moved relative to the head. The rotating head is a device used in semiconductor processing to initiate interactions with the surface of the substrate, for example a CMP head, an electrode for electrochemical deposition, a nozzle for distributing fluids, or a brush. The rotation and repositioning of the head is used to replicate certain semiconductor processes on a reduced scale to perform these processes combinatorially. For example, CMP is typically performed by rotating a platen in the presence of a slurry, and moving the substrate epicyclically relative to the platen. The techniques described herein may be used to perform multiple CMP experiments on a substrate and the results of the experiments may be compared to determine the efficacy and utility of certain operating characteristics of CMP.

Combinatorial Processing System

Figure 1A:
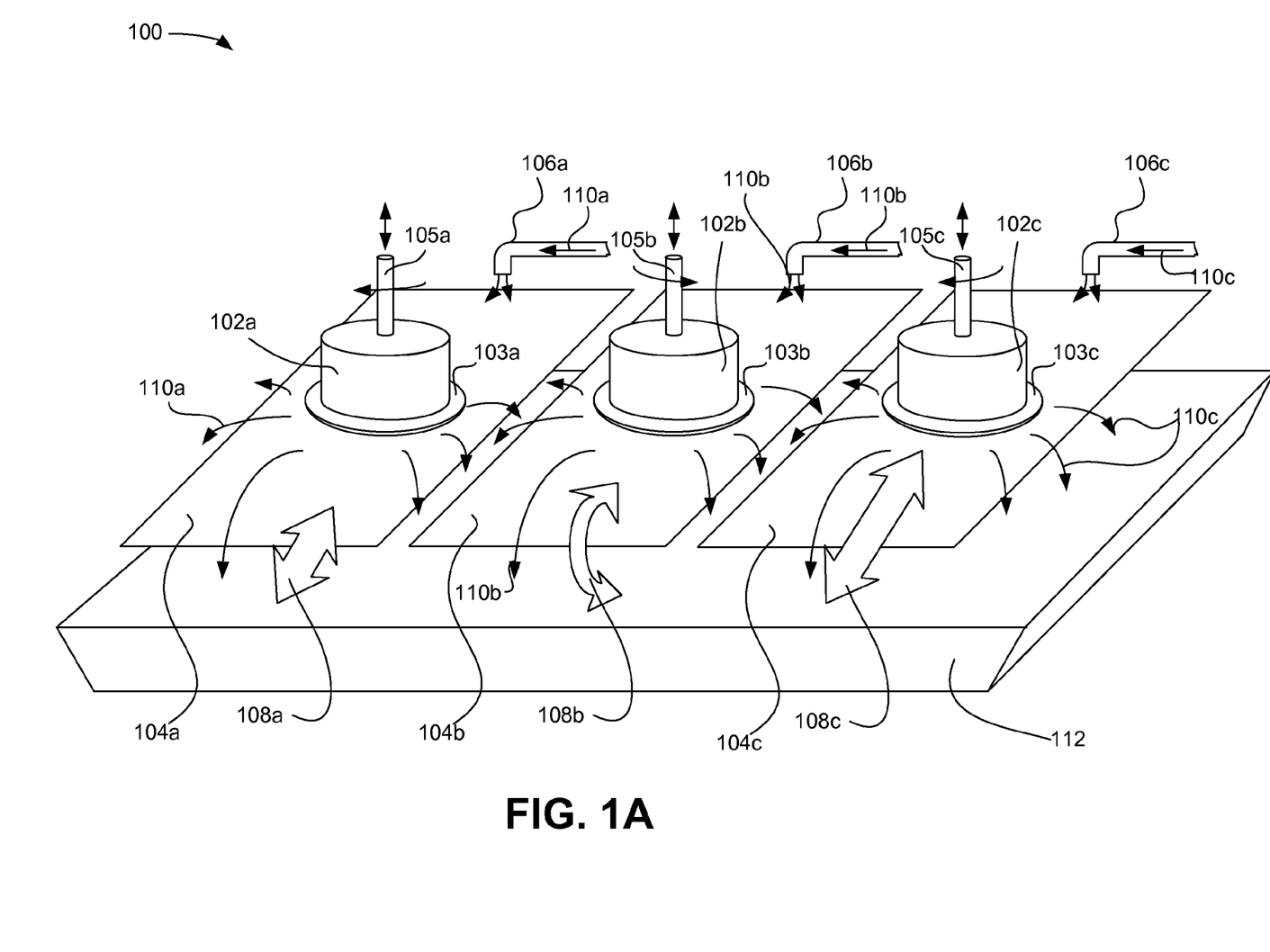
FIG. 1A illustrates a combinatorial processing system according to various examples.

FIG. 1A illustrates a combinatorial processing system 100 according to various examples. Combinatorial processing includes any processing (e.g., semiconductor processing) that processes two or more regions of a substrate. A substrate may be, for example, a silicon substrate such as a wafer that is used in semiconductor processing. A region of a substrate may be any portion of the substrate that is somehow defined, for example by dividing the substrate into regions having predetermined dimensions or by using physical barriers, such as sleeves, over the substrate. The region may or may not be isolated from other regions. For example, a substrate is divided into two or more regions, each of which may or may not include semiconductor device structures (e.g., metallization such as interconnects and vias, active elements such as transistors, etc.) A process is performed at each of the regions. For example, a first region is polished using a first slurry, and a second region is polished using a second slurry. The efficacies of the two slurries are evaluated, and none, one, or both of the slurries are selected as suitable candidates for larger scale processing (e.g., on a full wafer). According to other examples, multiple of the same experiment is performed on the same substrate, and any number of regions may be defined. For example, five slurries can be tested using fifteen regions of a substrate, each slurry being tested three times.

The combinatorial processing system 100 is used to perform, for example, combinatorial chemical mechanical planarization (CMP) or brushing. The semiconductor process evaluated using the system 100 could be any process that includes rotation and movement (i.e., repositioning) of the head. The combinatorial processing system 100 includes several rotatable heads 102a-102c (i.e., the heads 102), which are configured to process the regions 104 of at least one substrate. The heads 102 are attached to shafts 105, which are attached to motors or other devices for motivating (e.g., rotating) and repositioning the heads 102. For example, the shafts 105 are used to rotate and vary the speed of rotation of the heads 102. The shafts 105 may also be used to vary the downforce of the heads 102 onto the regions 104, which is an operating characteristic of the head that is varied for combinatorial CMP or other types of processing.

In some embodiments, the regions 104 are portions of a silicon or other semiconductor substrate, which may be a patterned or blanket substrate. The regions 104 can be of any size, such as 1"×2", 2"×2", 3"×3", and so on. The heads 102 can be configured to rotate at any speed, for example in the range of 1-60 revolutions per minute (rpm), and may be any size, for example 1", 2", or 3" in diameter. For CMP, the heads 102 include pads 103 that interact with the surface of the regions 104. For other processes, the pads 103 may be other devices used for those processes. For example, the pads 103 may be brushes used with cleaning processes.

CMP and other processes are performed according to various operating characteristics. Operating characteristics include the specifications of how the process is to be performed, such as speeds, rotational speeds, downward pressure on the head, temperatures, and chemical compositions of processing chemicals. For example, for CMP, operating characteristics include slurry composition, slurry temperature, pad composition, rotational velocity, downward pressure of the head, ambient temperature, and dispense rate. For cleaning, operating characteristics may include cleaning solution composition and temperature, brush material and structure, rotational velocity, downward pressure, ambient temperature and dispense rate. Semiconductor processes used in combinatorial processing often use processing fluids. A processing fluid may be any gas, liquid, plasma, colloid, suspension, etc. such as CMP slurries or cleaning solutions.

A region of a substrate may be any area in which a combinatorial process that may or may not be independent from other processes is performed. For example, as shown in FIG. 1A, three regions 104a, 104b, and 104c are shown. Each of the three regions 104 may be processed using different operating characteristics. For example, the combinatorial processing includes three different slurries introduced by the feed lines 106a-106c into the regions 104a-104c, respectively. In this example, the slurry in the region 104a may be an alumina slurry, the slurry in the region 104b may be a silica slurry, and the slurry in the region 104c may be a ceria slurry. The combinatorial processing is then used to determine the efficacies of these slurries. Alternatively, the heads 102 may each be driven by a drive system to vary the operating characteristics of the head 102, for example changing the pressure or rotational velocity of the head 102. Additionally, as an example of other variable characteristics, different CMP pad compositions may be used. For example, the head 102a uses a pad 103a with diamond particles, the head 102b uses a pad 103b with silica particles, and the head 102c uses a pad 103c without additional abrasives. CMP is described here, however, other semiconductor processes, such as cleaning and brushing, can also be evaluated using the system 100.

As shown here, the regions 104 are isolated, since processing fluids deposited by the feed lines 106a-106c typically stay within the regions 104a-104c, respectively. An isolated region is a region that is removed from neighboring and other regions such that interactions between regions are limited or prevented. For example, a region may be isolated by dicing one or more substrates to form the regions 104. A region may also be isolated by placing a cell around the region such that processing fluids are limited to interacting within that region (see, for example, FIGS. 2A and 3). Site isolation, in some embodiments, improves combinatorial processing by allowing specific processes to be examined without encountering contamination or interference from neighboring processes.

The heads 102 rotate within the regions 104, and the heads 102 can be repositioned relative to the regions 104 while they are rotating. The repositioning allows the heads 102 to replicate processes such as CMP, cleaning using brushing, electrochemical deposition, and other processes. For example, the heads 102 rotate and move throughout regions 104 to uniformly process portions of or the entire regions 104. The processed regions 104 can then be compared to each other and to other regions to determine which chemical compositions (e.g., which slurries) and which operating characteristics provide desirable results. In other embodiments, the regions 104 are not processed uniformly. For example, the region 104a may have portions that are processed using a first downward pressure, and portions that are processed using a second downward pressure.

One example of repositioning (i.e., movement) the heads 102 within the regions 104 is illustrated by the arrows 108. The arrows 108 illustrate the heads 102 moving back and forth within the regions 104. The movement or repositioning can be performed using a drive system attached to the heads 102. For example, the drive system can rotate the heads 102 while moving the heads 102 back and forth within the regions 104. As shown in FIG. 1A, a drive system can also move the heads 102 epicyclically (e.g., in a circle), in another predetermined pattern (e.g., a square), or in any other fashion.

The repositioning may be used to process various areas of the regions 104 to simulate CMP or other processes. According to other embodiments, the regions 104 are moved while the heads 102 are kept stationary to effect repositioning of the heads 102 relative to the regions 104. For example, the regions 104 could be mounted to moveable and rotatable wafer chucks.

For example, the arrow 108a shows the region 104a or the head 102a moving at a first speed, the arrow 108b shows the region 104b or the head 102b moving at a second speed and in an arcing motion, and the arrow 108c shows the region 104c or the head 102c moving at a third speed. The arrows 108 can also represent direction of travel of the repositioning (e.g., diagonal, back and forth, in an arc, elliptically, following another pattern, or in any other fashion) The results of processing the regions are compared, and one or more speeds represented by the arrows 108 may be chosen as effective and useful.

Processing fluids 110, such as slurries, are dispensed out of the feed lines 106, used to process the regions 104, and discarded into a trough 112 by the rotation and movement of the heads 102. The trough 112 is any device used to collect fluids such as CMP slurries. The trough 112 can also be attached to a waste line to remove the waste fluid, or can be manually emptied. According to other embodiments, the processing fluids may be distributed out of other orifices such as apertures within the heads 102 themselves (see FIG. 1A). In some embodiments, processing fluid 110a is different from processing fluid 110b, is different from processing fluid 110c. In these embodiments, more than trough 112 may be needed to collect the processing fluids 110, for example to keep the different processing fluids 110 from reacting with each other. In other embodiments, one or more of the processing fluids 110 has the same composition.

Figure 1B:
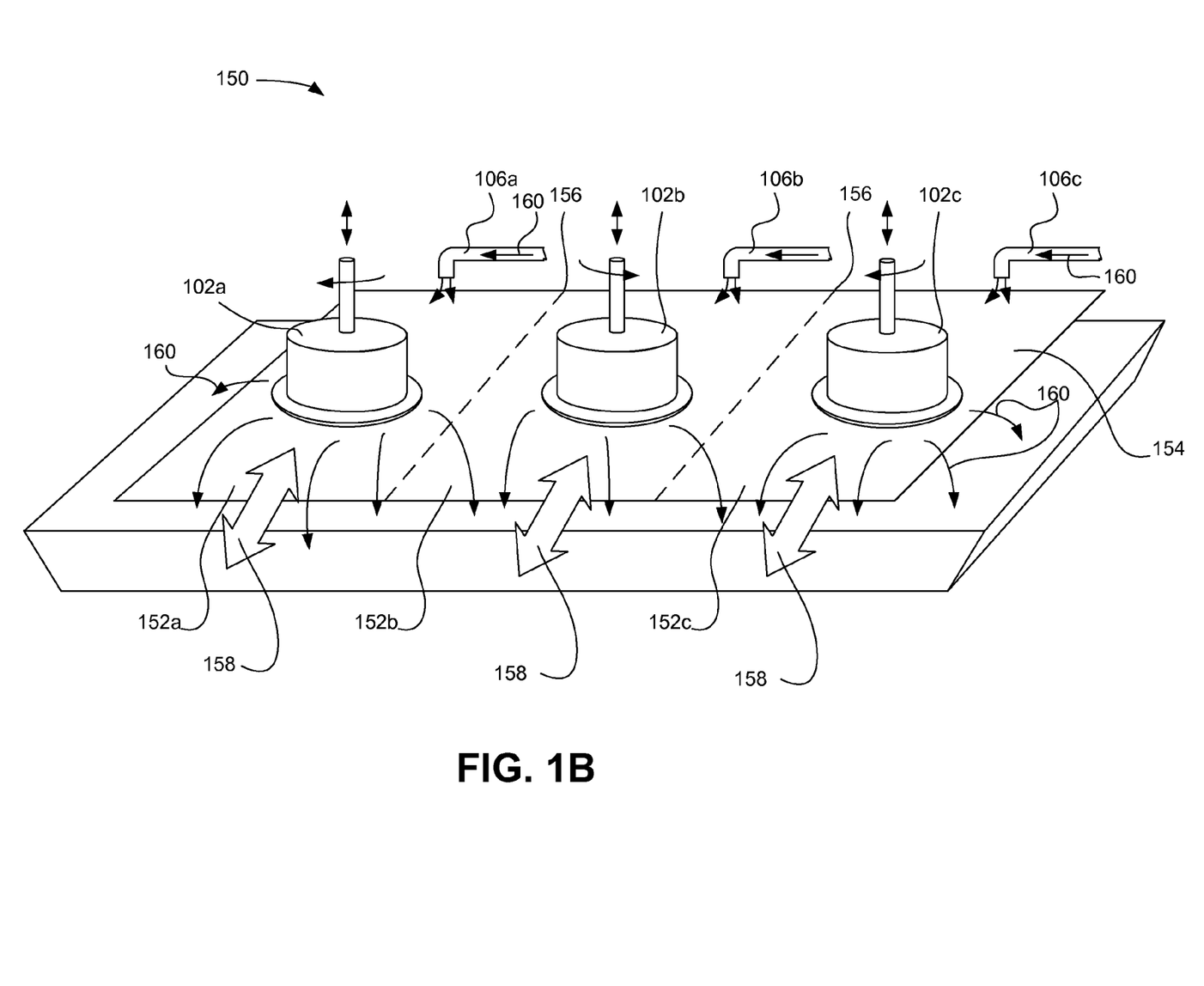
FIG. 1B illustrates a combinatorial processing system having contiguous (i.e., not isolated) regions.

FIG. 1B illustrates a combinatorial processing system 150 having contiguous (i.e., not isolated) regions 152. The combinatorial processing system 150 includes the multiple heads 102 operating on multiple regions 152; however, the regions 152 are on a single substrate 154, and the approximate divisions between the regions 152 are illustrated with lines 156.

Non-isolated regions, such as the regions 152 shown in FIG. 1B, may be used where, for example, the operating characteristics of the process to be altered are those relating to the characteristics of the heads 102. For example, the pressure (i.e., downforce), rotational velocity, or pad material of the heads 102 is varied between the heads 102. In this example, each of the feed lines 106 dispenses the same processing fluid (e.g., the fluid 160) throughout the regions 152. Other examples include different processing fluids for each of the regions 152, in which case the spacing between the regions is sufficient to avoid cross-contamination.

The substrate 154 may also be moved relative to the heads 102 as indicated by arrows 158. The speed of the movement of the substrate 154 is an operating characteristic that can be varied and evaluated. The substrate 154 can be moved, or the heads 102 can be individually moved. Where the substrate 154 is moved using, for example, a movable chuck, each of the heads 102 may have the same movement relative to the substrate 154. Where the heads 102 are moved relative to the substrate, using, for example, a drive system such as a motor, the movement of each of the heads 102 can be individually tailored. The substrate 154 and the heads 102 may be moved in any direction or pattern, and their movement may have any speed.

Other examples may combine attributes of the systems 100 and 150. According to one example, combinatorial processing is performed using three substrates having three regions each. Each individual substrate uses the same processing fluid. For example, the first substrate uses a silica slurry, the second substrate uses an alumina slurry, and the third substrate uses a ceria slurry. Each of the nine regions is then processed, and results can be evaluated.

Figure 1C:
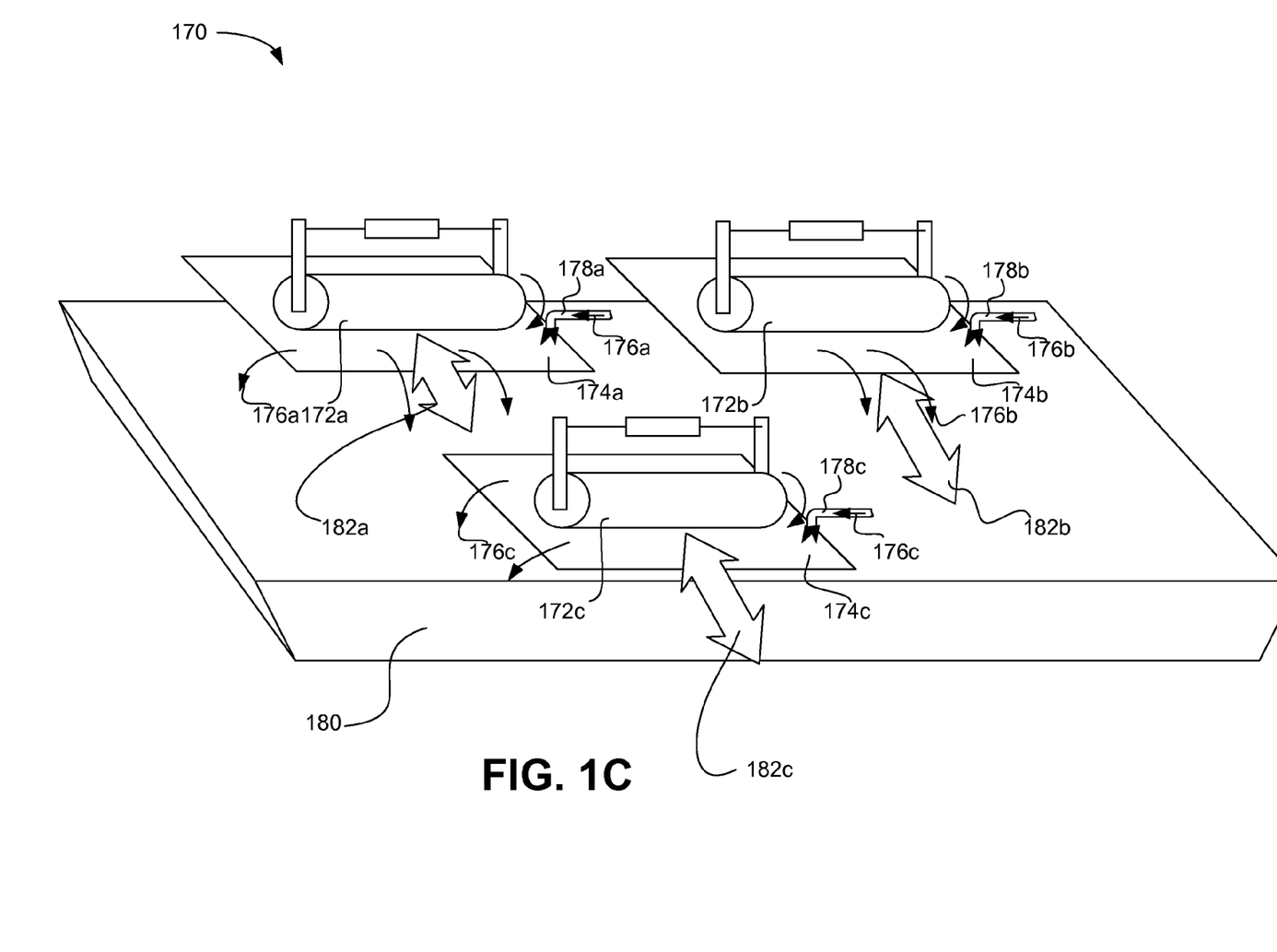
FIG. 1C illustrates a combinatorial processing system using rolling heads over multiple regions according to an embodiment.

FIG. 1C illustrates a combinatorial processing system 170 using rolling heads 172 over multiple regions 174 according to an embodiment. The rolling heads 172 are cylindrical rotatable heads that rotate along a different axis than the heads 102. The rolling heads 172a-172c process the regions 174a-174c, respectively, using processing fluids 176a-176c dispensed by feed lines 178a-178c. The processing fluids 176 are discarded from the regions 174 by the motion of the heads 172, and are collected by the trough 180.

The heads 172a-172c are also repositionable as shown by the arrows 182a-182c, respectively. The heads 172 are attached to a drive system that moves the heads 172 with respect to the regions 174 to reposition the heads 172 for simulation of various processes.

As with the systems 100 and 150, operating characteristics of the heads 172 including the composition of the fluids 178 are variable to perform combinatorial processing. For example, the rotational velocity of the heads 172, the composition (e.g., pad material) of the heads 172, the composition and temperature of the fluids 178, the speed and direction of the motion (as indicated by the arrows 182), and other operating characteristics are all variable to perform the combinatorial processing. Additionally, the heads 172 may be any type of head used for any process, such as a CMP head, a brush, an electrode, etc.

Although combinatorial processing systems 100, 150, and 170 having certain characteristics are shown here, it is understood that numerous variations are possible. For example, the heads 102 can have any shape or configuration and other techniques or systems for introducing and removing processing fluids can be implemented.

Site Isolation and Planetary Motion

Figure 2A:
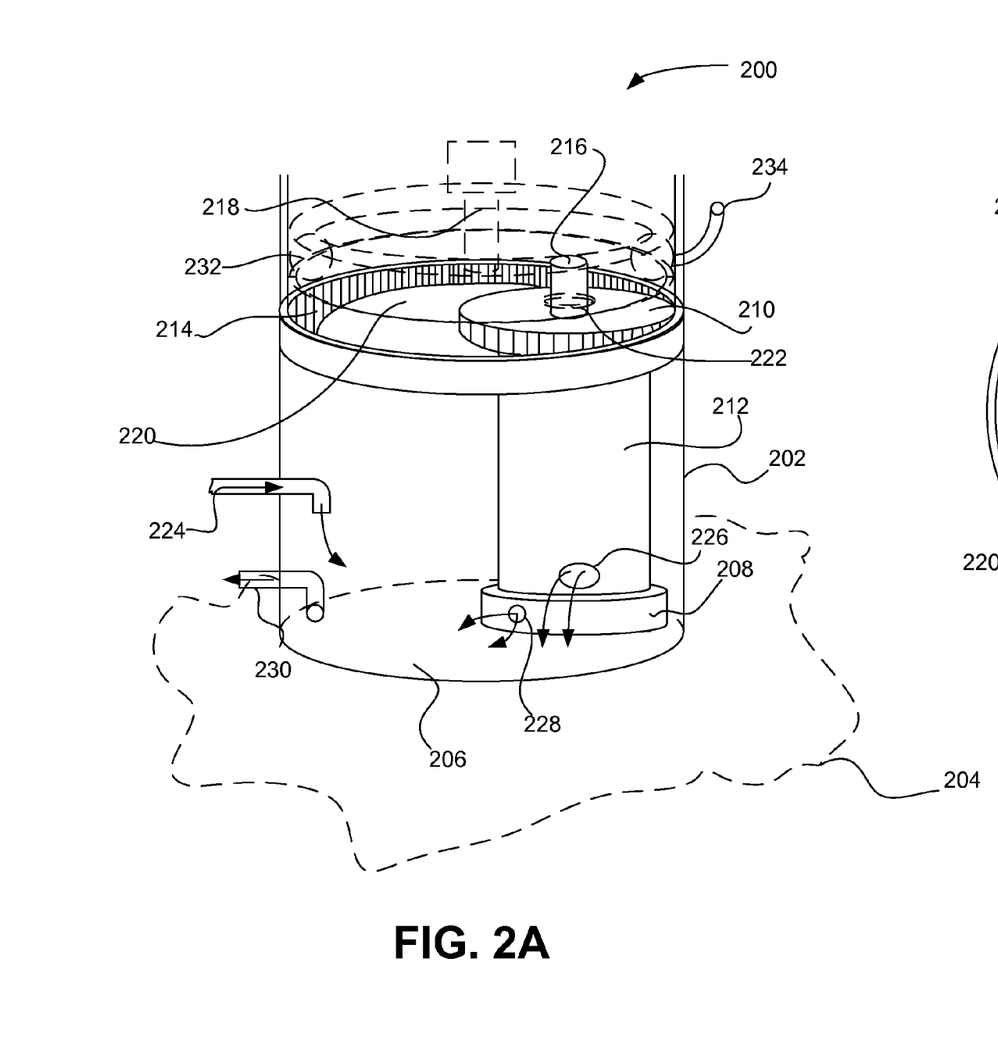
FIG. 2A illustrates combinatorial processing in a site isolated cell.
Figure 3:
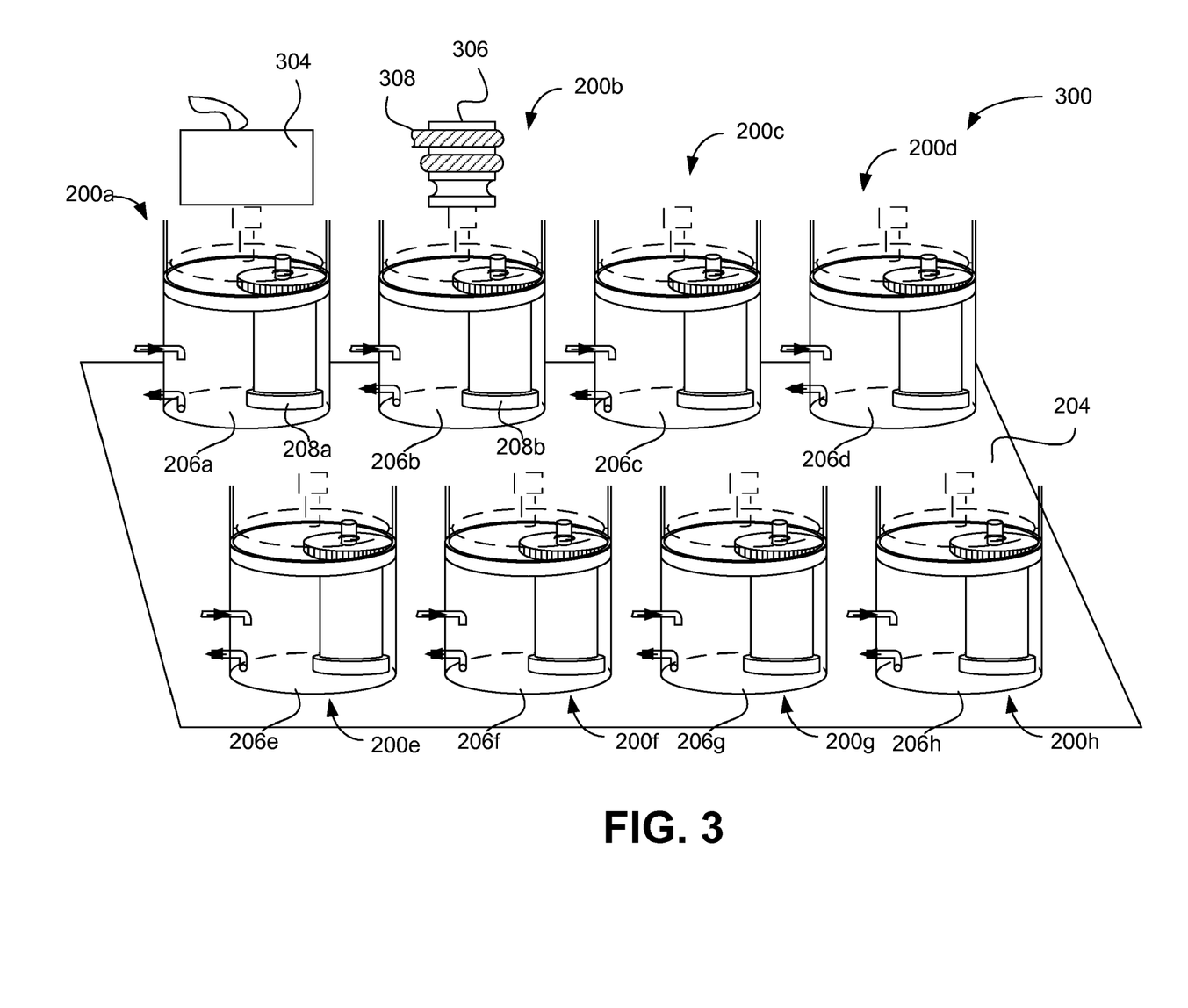
FIG. 3 illustrates combinatorial processing using site isolated cells.

FIG. 2A illustrates combinatorial processing in a site isolated cell 200. The cell 200 includes a sleeve 202 that isolates the cell 200 from outside processes and elements. The sleeve 202 provides a seal with a substrate 204 on which the process is performed, and the sleeve may include a grommet or other sealing mechanism that interfaces with the substrate 204 to prevent or limit the introduction or escape of fluids. The cell 200 therefore defines a site isolated region 206 on the substrate 204. One region 206 is shown here. FIG. 3 illustrates combinatorial processing using multiple cells 200 over multiple regions 206.

A rotating head 208 is used to perform combinatorial possessing. The head 208 includes a pad or brush in some applications. In other applications, the head 208 can be any head used in combinatorial processing, such as an electrode used for electrochemical deposition (i.e., electroplating, see FIG. 2C) or a nozzle for distributing fluids in the cell 200. The rotating head 208 is repositioned about the cell 200 and region 206 to replicate CMP and other processes. As shown here, the head 208 moves in a planetary (i.e., epicyclical) fashion around the region 206. The head 208 is attached to a planet gear 210 through a shaft 212. The planet gear 210 interfaces with a ring gear 214 to reposition the head 208 within the cell 200.

The planet gear 210 is attached to a shaft 216 that is attached to a spindle 218. The spindle 218 is further attached to a motor or other drive system for rotating the spindle 218 (see FIG. 3). The drive system may be any device capable of rotating and repositioning the head 208. The spindle 218 is attached to, and rotates a drive disc 220, which has a shaft guide 222, in which the shaft 216 rotates. The shaft guide 222 may also include a bearing to facilitate the smooth rotation of the shaft 216. When the spindle 218 is rotated by the motor or other drive system, the head 208 is repositioned about the cell 200 in an epicyclical or planetary fashion, using the planet gear 210 and ring gear 214 effect the rotation of the head 208. Other techniques for repositioning the head 208 (e.g., out of the pad itself, or other mechanisms used in full wafer systems) within the cell 200 are also possible. For example, the head 208 may move linearly (e.g., back and forth) or in a pattern (i.e., scribing a triangle or square). Although specific examples are shown here, it is understood that other mechanisms for repositioning and rotating the head 208 within the region 206 are possible.

Various techniques may be used to introduce processing fluids into the cell 200. A feed line 224 can be used to introduce fluids into the cell 200, similar to the feed lines 106 described above. Additionally, or alternatively, aperture 226 in the shaft 212 and aperture 228 in the head 208 are used to introduce fluids into the region 206. The fluids travel through the shaft 212, for example. The fluids can be dispensed out of the aperture 226 and over the head 208, which can cause the fluid to collide with the head 208, distributing the fluid throughout the cell 200. Additionally, or alternatively, the fluids can be dispensed out of the aperture 228 in the head 208. There may also be other apertures in the head 208 and the shaft 212. The cell 200 also includes a waste line 230, which is used to remove fluids from the cell 200. There could also be additional feed or waste lines, for example lines to introduce air, nitrogen gas, etc. into the cell 200.

Downward pressure on the head 208 is provided using various techniques. For example, the cell 202 may include a bladder 232. The bladder 232 may have a ring shape, and may include a seal against the side of the cell 202. The bladder 232 presses against the drive disc 220, and is inflated or deflated using an air line 234 to increase or decrease the downward pressure of the head 208 against the substrate 204. Other techniques can be used to adjust the downward pressure on the substrate 204. For example, the drive disc 220 can be mechanically adjustable using a screw mechanism to change the height of the drive disc 220 relative to the substrate 204.

Figure 2B:
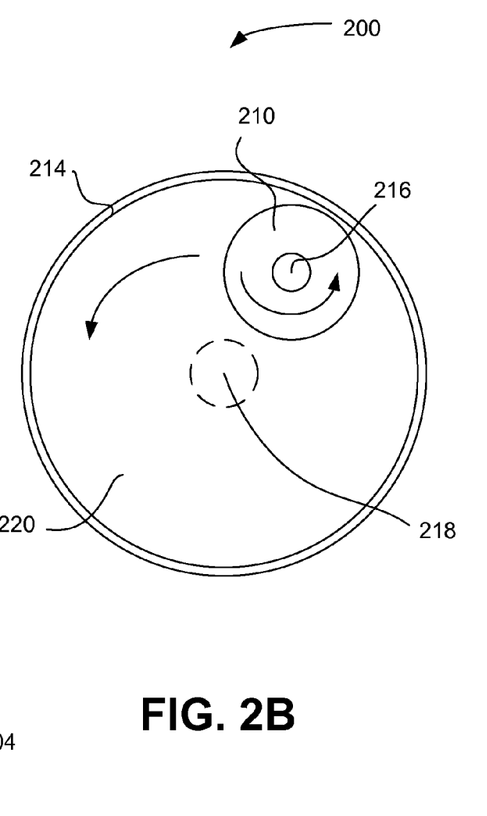
FIG. 2B shows an overhead view of the cell.

Planetary or epicyclical motion of the head 208 in the cell 200 can be used to simulate CMP, brushing, electrochemical deposition, cleaning or fluid distribution, or other semiconductor processes (see, e.g., examples in U.S. patent application Ser. No. 11/763,180, entitled "Combinatorial Processing Including Stirring" and filed Jun. 14, 2007). FIG. 2B shows an overhead view of the cell 200. In FIG. 2B, it can be seen that the planet gear 210 rotates while it and the head 208 are repositioned around the cell 200. The rotation of the planet gear 210 results in the rotation of the head 208 through the shaft 212.

In one embodiment, the rotating head 208 may be a substrate onto which an layer is to be deposited using electroless deposition. The processing fluids, including the activation solutions and the electroless solutions, can be introduced into the cell 200 using the feed line 224 or aperture 226, for example. The layer can be deposited, and the processing fluids evacuated from the cell 200 using the drain line 230. Combinatorial electroless deposition can be used to evaluate various copper capping integration schemes, for example.

Figure 2C:
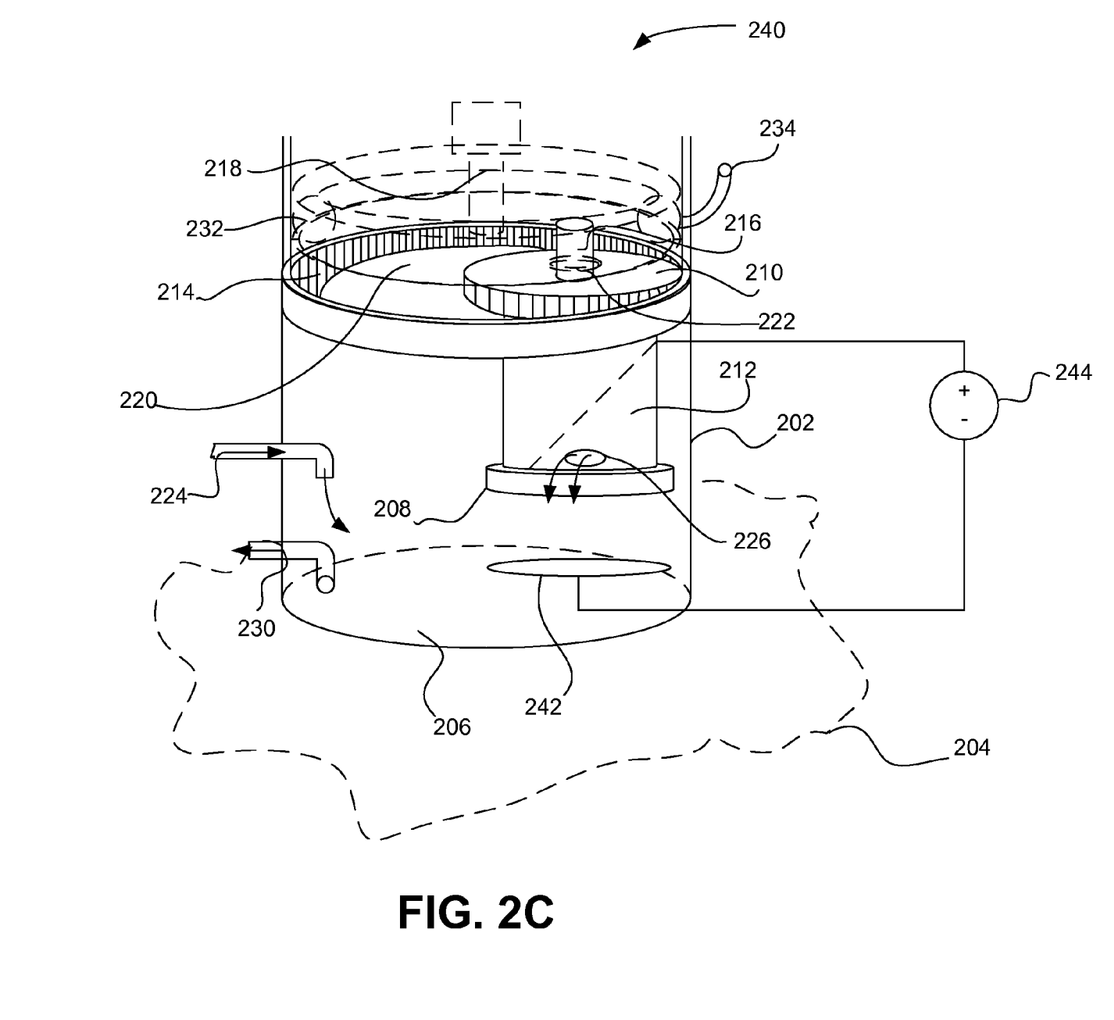
FIG. 2C illustrates combinatorial electrochemical deposition in a site isolated cell.

FIG. 2C illustrates using a cell 240 for electrochemical deposition with planetary motion of an electrode. The cell 240 may be used to deposit a metal layer, such as a copper or nickel layer, on a substrate. The cell 240 includes two electrodes: the rotating head 208, and an electrode 242. Either of the rotating head 208 or the electrode 242 may be the working electrode. The working electrode is the object to be plated. For example, the rotating head 208 may be a substrate such as a portion of a wafer. The electrode 242 would then be a counter electrode. Alternatively, the electrode 242 is the working electrode (i.e., the object to be plated). In another embodiment, the substrate 204 may be the counter electrode, and the electrode 242 may be omitted. In this embodiment, the substrate could include a conductive surface and be held to ground, while the rotating head 208 has a potential applied relative to the substrate 204.

The rotating head 208 and the electrode 242 (or the substrate 204) are connected to a potentiostat 244 that creates a potential across the rotating head 208 and the electrode 242 (or the substrate 204). The cell 240 is filled with an electrolyte, which is a solution including metal to be deposited on a conductive object during electrochemical deposition. The electrolyte can be introduced into the cell 240 using any of the techniques described above (e.g., with the feed line 224 or aperture 226), or using any other technique. When the potentiostat 244 generates a current, metal ions in the electrolyte are plated on the working electrode (either the rotating head 208 or the electrode 242, depending on configuration).

The movement and rotation of the rotating head 208 agitates the electrolyte and may promote uniform layer deposition across the rotating head 208 if the rotating head 208 is the working electrode. Additionally, the electrode 242 can be configured to rotate, either in the same direction as the rotating head 208 or counter to the rotating head 208. Further, any distance between the rotating head 208 and the electrode 242 can be used, the electrode 242 can have any size (e.g., substantially the same diameter as the cell 242), or the electrode 242 may be configured to move within the cell 240.

Combinatorial processing can be performed using the cell 240 by varying the operating characteristics of the electrochemical deposition. For example, the composition of the electrolyte, amount of current, current density, voltage, plating time, distance between the electrode 242 and rotating head 208, speed and direction of rotation and movement of the electrode 242 and/or rotating head, and temperature can all be varied. The results of these variations can be compared to determine useful processing conditions for full-wafer processing.

Figure 2D:
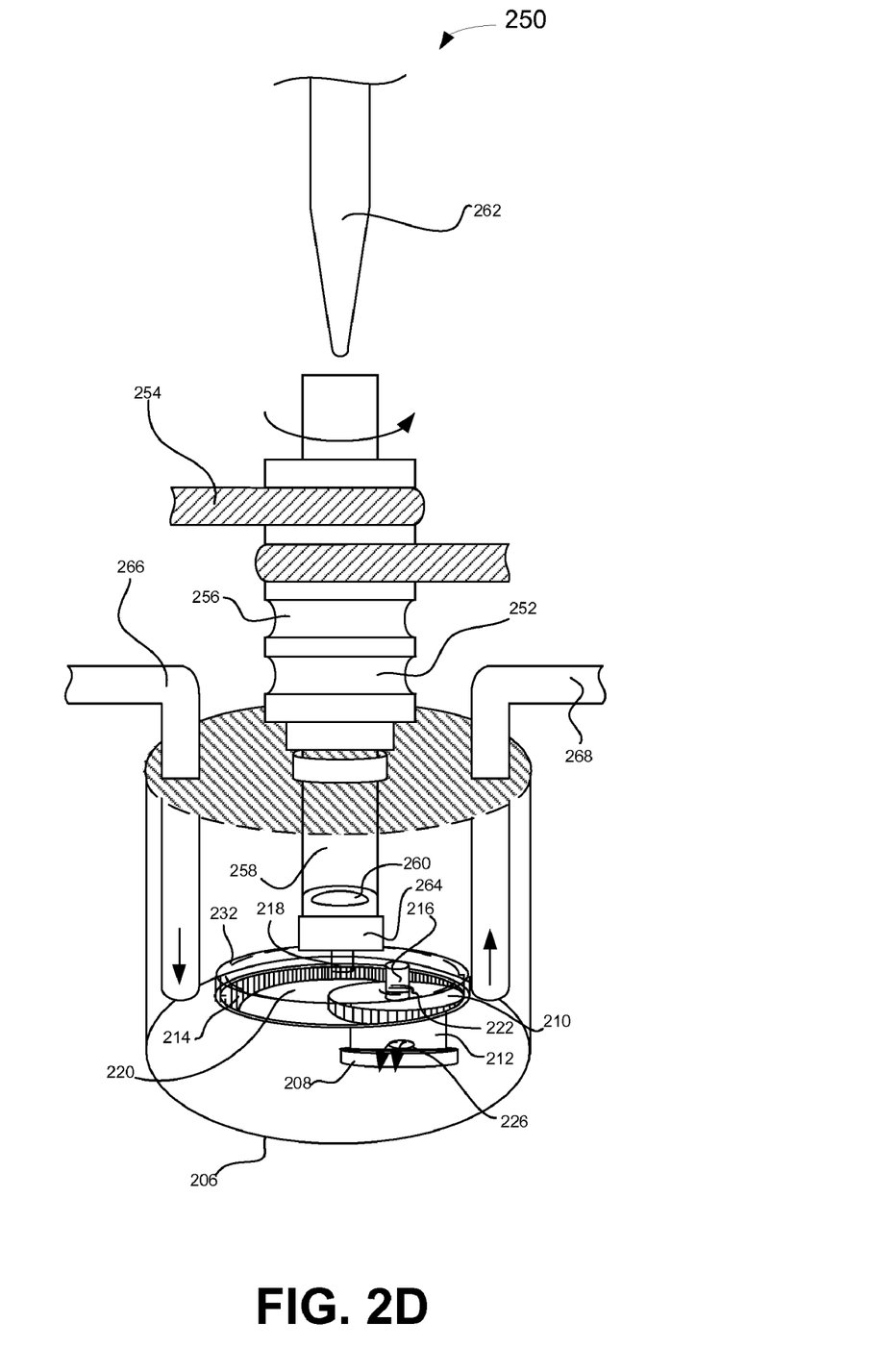
FIG. 2D illustrates an alternative configuration for providing planetary motion in a cell.

FIG. 2D illustrates an alternative configuration for providing planetary motion in a cell. The cell 250 is similar to some described in U.S. patent application Ser. No. 11/763,180, entitled "Combinatorial Processing Including Stirring" and filed Jun. 14, 2007. The cell 250 includes a stirrer 252 does not reposition within the cell 250 and rotates using belts 254 that engage with grooves 256. The stirrer 252 further includes an end 258 that may have an aperture 260 through which processing fluids are dispensed and distributed onto the region 206. A dispenser 262 is used to introduce fluids into the stirrer 252 from another source. For example, the dispenser 262 may withdraw processing fluids from an external reservoir, and then dispense them into the hollow stirrer 252, which then dispenses the fluids into the cell 250.

As with the cell 200, for example, the shaft 212 and the head 208 may include apertures (e.g., the aperture 226) to dispense fluids into the cell 250. A feed line 266 can be used in addition to or instead of the apertures 260 and 226, and a waste line 268 can be used to remove process fluids from the cell 250.

The planetary motion of FIGS. 2A-2C is adapted to work with the stirrer 252. The spindle 218 now includes a coupler 264 into which the end 258 of the stirrer 252 is inserted. When the stirrer 252 rotates (e.g., using the belts 254), the spindle 218 and the drive disc 220 rotate, moving the planet gear 210 around the ring gear 214. The motion causes the head 208 to rotate and reposition about the region 206 and within the cell 250. The ring gear 214 may be secured (e.g., by attaching it to the feed line 266 and waste line 268, or some other part of the cell 250) to prevent it from rotating when the stirrer 252 is rotated.

The cell 250 may be useful for any type of processing operation including a rotating head 208. For example, the rotating head 208 may include a brush, and the cell 250 may be used for combinatorial brushing experiments to test cleaning solutions and techniques. Any other processing technique, including CMP and electrochemical deposition, may also be performed using the cell 250, and the cell 250 may be used in a combinatorial manner as is described with regard to FIG. 3.

Site Isolated Combinatorial Processing

FIG. 3 illustrates combinatorial processing using site isolated cells. A combinatorial processing system 300 includes several cells 200 and regions 206 on the substrate 204. The cells 200 and regions 206 are labeled 200a-200h and 206a-206h, respectively, to differentiate between differing combinatorial cells having similar elements and characteristics. The cells 200 may be used to effect combinatorial processing. For example, the cells 200 may be used to validate a CMP process. In an example, the cells 200a-200d use a first slurry formulation, and the cells 200e-200h use a second slurry formulation. The cells 200a-200d may all have different operating characteristics. For example, the head 208a in the cell 200a rotates at 20 revolutions per minute (rpm), the head 208b in the cell 200b rotates at 30 rpm, and so on. The results of these processes are evaluated, for example using metrology (e.g., electrical testing, microscopy such as atomic force microscope (AFM) images) to determine an efficacy of the various processes. One or more of the operating characteristics (e.g., slurry composition, pad composition, rotational speed, etc.) can be chosen for processing on a full substrate based on these results.

The head 208a in the cell 200a is rotated and repositioned using a drive system such as a motor 304. The motor 304 is any type of motor, such as an electric or manually operated motor. The motor 304 is attached to the spindle 218, and causes the spindle 218 to rotate, which causes the head 208a to rotate and reposition itself around the cell 200a. The head 208b in the cell 200b is attached to another type of drive system, a pulley 306 that is motivated by one or more belts 308. The belts 308 may be attached to an external source such as an electric motor, and multiple heads 208 in multiple cells 200 may be motivated by an interconnecting system of belts and pulleys. It is further understood that several other systems for motivating the heads 208 may be used, including magnetic and manual systems.

A typical CMP process on a full substrate can include placing the substrate on a chuck, rotating a platen including a CMP pad, and moving the substrate in an epicyclical fashion around the platen. The process can be replicated in a combinatorial manner using the system 300 shown in FIG. 3. Using the system 300, for example, one or more different CMP slurries is introduced into the regions 206. The operating characteristics of the heads 208 can be varied in each cell 200, and the results of the processing can be evaluated. According to some embodiments, the same operating characteristics are used in more than one cell 200. For example, the regions 206a and 206b are processed using the same slurry composition, pad composition, rotational velocity, etc., so that more than one set of results for the same characteristics can be evaluated. In this way, it can be determined whether the results are consistent.

In other embodiments, the cells 200 are used to evaluate cleaning using brushing. For example, a brush is mounted at the end of the head 208. The brush may be made from polyvinyl alcohol (PVA), or other materials such as other polymers, plastics, natural materials, etc. The brush can be made from any grade of PVA having any porosity, and the PVA may or may not be cross-linked. The brush may have any shape, such as a disc shape or a cylindrical shape, and may or may not have nubs or other features to assist with cleaning. As with CMP, the operating characteristics of brushing can be evaluated. For example, the composition of cleaning solutions, rotational velocity, downward pressure on the head 208 and other characteristics may be varied across the regions 206.

Contactless Brushing

Figure 4A:
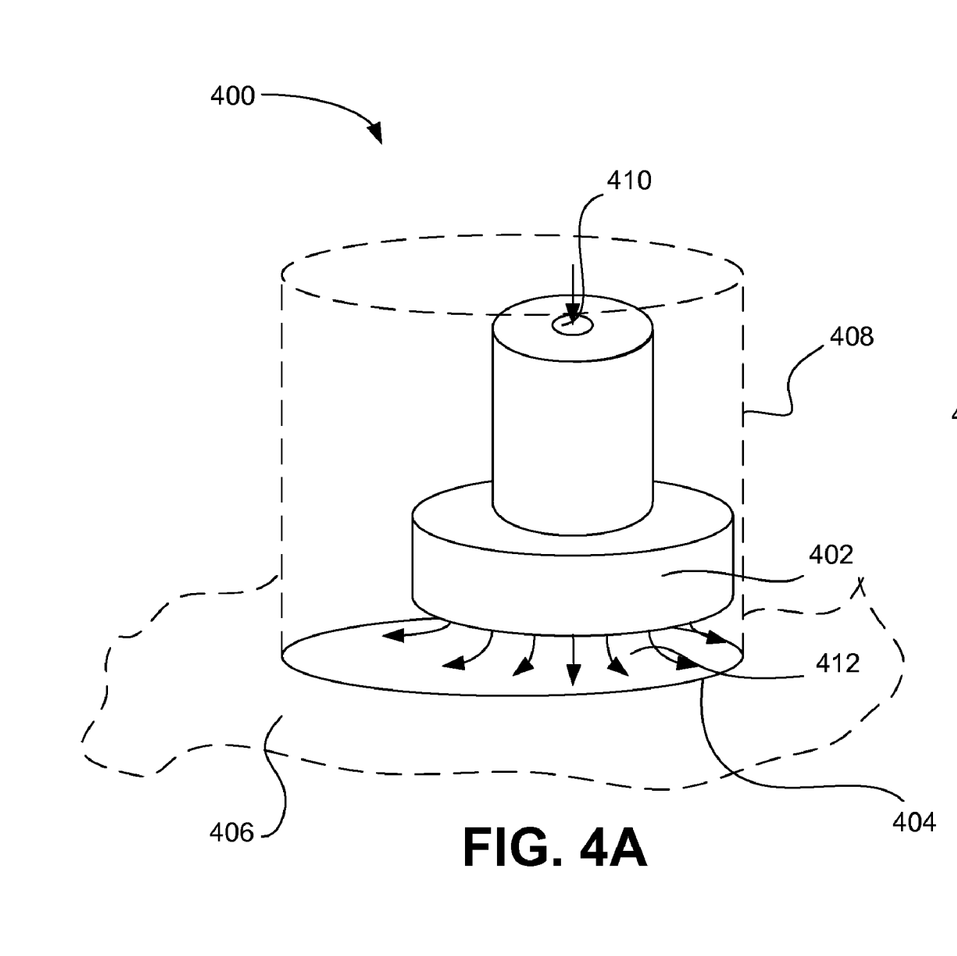
FIG. 4A illustrates a perspective view of a head for performing contactless brushing (e.g., cleaning) of a region of a substrate in a cell.

FIG. 4A illustrates a head 402 for performing contactless brushing (e.g., cleaning) of a region 404 of a substrate 406 in a cell 400. Contactless brushing is using cleaning fluids to clean a substrate without the head out of which the fluids are dispensed touching the substrate surface. The cell 400 is a site-isolated cell having a sleeve 408 to isolate the region 404 from other regions of the substrate 406 according to one example. The head 402 is configured to clean the region 404 using contactless brushing. For example, cleaning solutions enter (e.g., are introduced into) the head 402 through a first aperture 410. The cleaning solutions 412 exit the head 402 through a second aperture 414 (see FIG. 4B) and are distributed throughout the region 404 by the rotation of the head 408. The pressure of the cleaning solutions against the region 404 and the rotation of the head 408 cause a Bernoulli effect to float the head 402 above the region 404 and accomplish contactless brushing and cleaning. The head 402 may be attached to a spring or other mechanism to allow the head 402 to move up and down over the region 404.

Figure 4B:
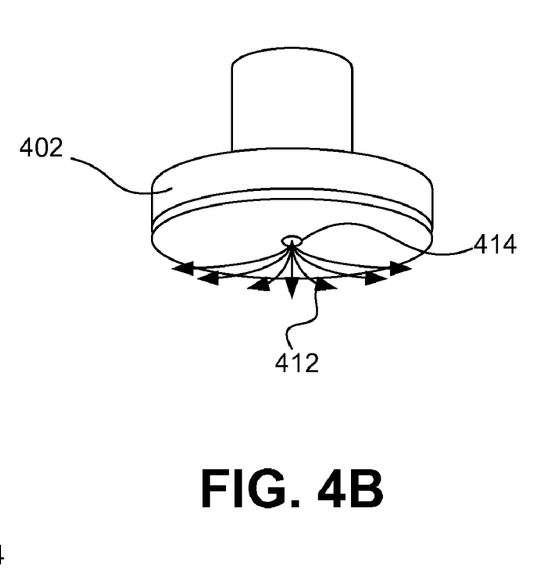
FIG. 4B illustrates the underside of the head shown in FIG. 4A.

FIG. 4B illustrates the underside of the head 402. A second aperture 414 distributes the cleaning solutions 412 out of the head 402. The second aperture 414 may be beveled, straight, or have any other shape depending on the flow characteristics desired. Additionally, there could be any number of apertures 414 distributing the cleaning solutions 412 out of the underside of the head 402 or elsewhere in the cell 400. Other known mechanisms for distributing fluids 412 into the cell 400 can also be used.

In one embodiment, the head 402 rotates and is repositioned around the cell 400 using techniques similar to those described above regarding FIGS. 1A and 2A. For example, the head 402 is rotated using a motor or indirect motivation (e.g., a belt and pulley system). The head 402 is further repositioned about the region 404 by moving the head 402 linearly, epicyclically, or in any other fashion. In other embodiments, the head 402 can remain stationary.

Process for Combinatorial Processing

Figure 5:
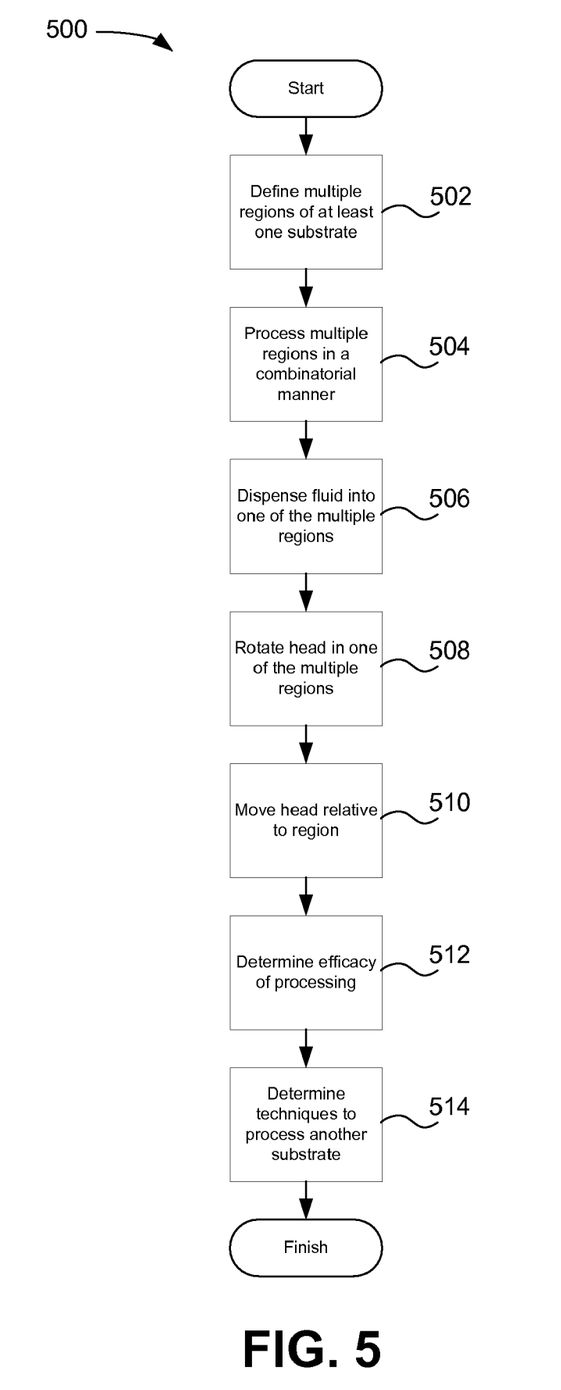
FIG. 5 is a flowchart describing a process for processing multiple regions of a substrate in a combinatorial manner using a rotating and repositionable head according to various examples.

FIG. 5 is a flowchart describing a process 500 for processing multiple regions of a substrate in a combinatorial manner using a rotating and repositionable head according to various examples.

In operation 502, multiple regions of at least one substrate are defined. The multiple regions are, for example, the regions 104 or 206 described above. The regions may include structures on which combinatorial processing is to be performed. For example, the regions include dielectric and conductive regions (e.g., metallization), deposited metals, semiconductor devices (transistors, diodes), etc. The regions may be predefined, and a substrate may include any number of regions.

The regions may be on a single substrate (as shown in FIGS. 1B and 3), or may be distributed amongst multiple substrates (such as shown in FIG. 1A). The configuration of the multiple regions is chosen based on the desired properties of the combinatorial system as well as the operating and other characteristics that are to be evaluated. For example, some CMP processes reposition the substrate being planarized around a rotating platen. If a combinatorial process is to simulate these CMP processes, the regions may be individually defined (e.g., individual substrates as shown in FIG. 1A), and the regions may be repositioned relative to the heads.

In operation 504, the multiple regions are processed in a combinatorial manner. The processing may include preparing the regions for combinatorial processing, or actual combinatorial processing such as performing CMP, brushing (including contactless brushing), depositing a masking layer (e.g., a self-aligned monolayer), depositing a capping layer (e.g., a copper capping layer using electroless deposition), or performing a clean operation. Other combinatorial processes, including various types of depositions (e.g., electrochemical deposition, physical vapor deposition (PVD), chemical vapor deposition (CVD)) are also possible, and may be performed in addition to those operations that include rotation and repositioning.

In one embodiment, processing the multiple regions includes processing with a plurality of characterizations. In other words, the multiple regions are processed so that one or more regions is processed differently from one or more other regions. For example, one region on a substrate is processed using a linear motion of the head, and another region on the substrate is processed using an epicyclical motion. The resulting regions will have different characteristics based on the type of motion that was used to process them.

In operation 506, a fluid is dispensed into one of the multiple regions. The fluid is dispensed using a feed line (e.g., the feed lines 106) or an aperture in the head, for example. The fluid is a processing fluid, for example a cleaning fluid or a CMP slurry. The fluid is chosen based on the requirements of the combinatorial process, and in some embodiments is varied from region to region to evaluate the efficacies of various fluids. In other embodiments, the same fluid is dispensed into one or more regions.

In operation 508, a head is rotated in one of the multiple regions to perform the processing. Rotating the head includes rotating the head about its axis, for example by using a motor to rotate a spindle (e.g., the spindle 218 attached to the head 208) to perform polishing, brushing or other processing techniques.

Additionally, in some embodiments, the rotation of the head agitates the fluid dispensed in operation 506. The fluid is dispensed into the region, and collides with the head as the fluid is being dispensed or is agitated by the head after the fluid is in the region and the cell. Agitation may improve and promote surface chemistry and the interaction of the fluids with the surface of the substrate.

In operation 510, the head is moved relative to one of the multiple regions. The head is moved linearly, epicyclically (i.e., in a planetary fashion), in some combination of linear and epicyclical motion, or in any other fashion. The head may be moved while the substrate is held stationary, or the substrate may be moved relative to the head. For example, the substrate is divided into multiple regions, and the multiple regions are rotated relative to the head. The regions (i.e., substrate pieces) could also be moved linearly or in any other way relative to the head.

Also in operation 510, operating characteristics, e.g., one or more of a downward pressure of the head, a rotational velocity of the rotating, a slurry chemistry, a pad material, a dispense rate, an electrolyte composition, a current, current density, or voltage of an electrochemical deposition, etc. are varied. The variations are made to effect combinatorial processing. For example, one region uses a first slurry, a first rotational velocity, and a first downward pressure, while a second region uses a second slurry, a second rotational velocity, and a second downward pressure. Other characteristics, such as operating temperatures and pad compositions can also be varied. The operating characteristics described above are related to CMP, however, other operating characteristics may be varied and used depending on the combinatorial processes used.

In operation 512, the efficacy of the processing is determined. Operation 512 may be considered part of a combinatorial evaluation process. For example, the varying described regarding operation 510 is performed. The results of the varying are reviewed to determine the efficacy of the operating characteristics chosen. If the operating characteristics are effective, useful, or somehow otherwise desirable, one or more of the characteristics may be used with a full substrate, as described regarding operation 514.

According to another example, the multiple regions of the at least one substrate each include at least one structure. At least a portion of the structure is formed to perform tests on the structures, and the structure may be any semiconductor feature, including front end of the line (FEOL) features such as transistors, or back end of the line (BEOL) features such as metallization. Determining the efficacy of the varying may include evaluating the characteristics of the structure after the processing, for example.

In operation 514, techniques to process another substrate are determined. The techniques may be based on the varying. For example, based on the efficacy of the varying, it is determined that a certain formulation is useful for a full substrate. The techniques include using the various operating characteristics described regarding operation 510, for example.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method, comprising:
    defining multiple regions of a substrate including a first region and a second region of the substrate;
    processing the multiple regions of the substrate using a first set of operating characteristics in the first region and a second set of operating characteristics in the second region so that the first region has different characteristics than the second region as a result of the processing;
    rotating a first head in the first region and a second head in the second region to perform the processing;
    repositioning the first head relative to the first region while rotating the first head during the processing and repositioning the second head relative to the second region while rotating the second head during the processing; and
    wherein defining multiple regions of a substrate comprises isolating the multiple regions using a sleeve during the rotating and repositioning.

2. The method of claim 1, further comprising:
    dispensing a first fluid into the first region and a second fluid into the second region;
    agitating the first fluid using the first head to facilitate interaction of the first fluid with a first surface of the first region; and
    agitating the second fluid using the second head to facilitate interaction of the second fluid with a second surface of the second region.

3. The method of claim 2, wherein the first fluid and the second fluid are chosen from the group consisting of a slurry, a cleaning solution, and an etching solution.

4. The method of claim 1, wherein rotating the first head and the second head comprises performing chemical mechanical planarization (CMP) in the first and second regions.

5. The method of claim 4, further comprising varying one or more of a downward pressure of the head, a rotational velocity of the rotating, a slurry chemistry, a pad material, and a dispense rate.

6. The method of claim 5, further comprising:
comparing the resulting first region and the resulting second region after the processing and determining an efficacy of the processing; and
using one of the first set of operating characteristics and the second set of operating characteristics to process another substrate based on the comparing.

7. The method of claim 1, wherein repositioning the first head comprises at least one of moving the first head linearly and moving the first head epicyclically.

8. An apparatus, comprising:
a first rotating head to process a first region of a substrate and a second rotating head to process a second region of the substrate;
at least one drive system connected to the first rotating head and the second rotating head to move the first and second rotating heads in the first and second regions and to vary a first set of operating characteristics of the first rotating head within the first region as compared to a second set of operating characteristics of the second rotating head within the second region; and
wherein the first rotating head and the second rotating head are configured to process the substrate so that the first region has different characteristics than the second region; and
a sleeve to isolate the first region from the second region and to contain the first rotating head.

9. The apparatus of claim 8, further comprising a feed line to dispense a fluid into the first region.

10. The apparatus of claim 9, wherein:
the first rotating head comprises a chemical mechanical planarization (CMP) pad; and
the fluid comprises a CMP slurry.

11. The apparatus of claim 9, wherein the operating characteristics comprise pressure, rotational velocity, fluid composition, pad material, and dispense rate.

12. The apparatus of claim 8, wherein the at least one drive system is configured to provide linear motion, planetary motion, or a combination of linear and planetary motion.

13. The apparatus of claim 8, wherein the drive system comprises:
a motor;
a planet gear attached to the motor; and
a ring gear to interface with the planet gear, the planet gear to rotate about the ring gear using the motor.

* * * * *